(12) United States Patent
Nakamura (10) Patent No.: US 8,368,473 B2
(45) Date of Patent: Feb. 5, 2013

(54) RESONATOR AND OSCILLATOR USING SAME

(75) Inventor: Kunihiko Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/063,316

(22) PCT Filed: May 21, 2010

(86) PCT No.: PCT/JP2010/003440
§ 371 (c)(1),
(2), (4) Date: Mar. 10, 2011

(87) PCT Pub. No.: WO2010/143363
PCT Pub. Date: Dec. 16, 2010

(65) Prior Publication Data
US 2011/0163817 A1  Jul. 7, 2011

(30) Foreign Application Priority Data
Jun. 9, 2009  (JP) ................. 2009-138455

(51) Int. Cl.
*H03B 5/32* (2006.01)
(52) U.S. Cl. .............. 331/107 A; 331/156; 331/154
(58) Field of Classification Search .......... 331/107 A, 331/156, 154
See application file for complete search history.

(56) References Cited

U.S. PATENT DOCUMENTS

| | | | |
|---|---|---|---|
| 6,577,040 B2 | 6/2003 | Nguyen | |
| 6,995,622 B2 | 2/2006 | Partridge et al. | |
| 7,358,638 B2 | 4/2008 | Miyashita et al. | |
| 7,741,932 B2 | 6/2010 | Nakamura | |
| 2005/0151592 A1 | 7/2005 | Partridge et al. | |
| 2006/0022764 A1 | 2/2006 | Partridge et al. | |
| 2006/0033589 A1 | 2/2006 | Partridge et al. | |
| 2007/0082642 A1 | 4/2007 | Hattori | |
| 2007/0096850 A1 | 5/2007 | Huang et al. | |
| 2007/0188268 A1 | 8/2007 | Naito et al. | |
| 2008/0164953 A1 | 7/2008 | Partridge et al. | |
| 2008/0204153 A1 | 8/2008 | Yoshida et al. | |
| 2009/0224850 A1 | 9/2009 | Nakamura | |

FOREIGN PATENT DOCUMENTS

| | | |
|---|---|---|
| JP | 02-166803 A | 6/1990 |
| JP | 07-301535 A | 11/1995 |
| JP | 2000-55670 A | 2/2000 |
| JP | 2004-112378 A | 4/2004 |

(Continued)

OTHER PUBLICATIONS

International Search Report for PCT/JP2010/003440 dated Aug. 17, 2010.

*Primary Examiner* — Arnold Kinkead
(74) *Attorney, Agent, or Firm* — Pearne & Gordon LLP (57) ABSTRACT

There is provided with a resonator which can correct the resonance frequency of a vibrator in a wide range and with a high accuracy and also provided with an oscillator using the resonator. In the resonator configured by the vibrator 101, electrodes 4, 5 disposed so as to oppose to parts of the surface of the vibrator 101 via gaps, and variable voltage sources 24, 25 for applying a voltage to both or one of the vibrator 101 and the electrodes 4, 5, each of the electrodes 4, 5 is configured by plural electrodes. The electrodes 4, 5 are respectively disposed via gaps close to the portions of the vibrator 101 having different vibration amplitudes. The DC voltages being applied are independently adjusted with respect to the electrodes 4, 5 which differ in distances from the shaft of the vibrator among the plural electrodes close to the vibrator 101.

11 Claims, 11 Drawing Sheets

FOREIGN PATENT DOCUMENTS

| | | |
|---|---|---|
| JP | 2005-39263 A | 2/2005 |
| JP | 2005-354651 A | 12/2005 |
| JP | 2006-33450 A | 2/2006 |
| JP | 2006-238265 A | 9/2006 |
| JP | 2007-518351 A | 7/2007 |
| JP | 2008-211420 A | 9/2008 |
| JP | 2009-100009 A | 5/2009 |
| JP | 2009-118331 A | 5/2009 |
| WO | 2004-032320 A | 10/2003 |
| WO | 2006/013741 A1 | 2/2006 |

PRIOR ART

RESONATOR AND OSCILLATOR USING SAME

TECHNICAL FIELD

The present invention relates to a resonator and an oscillator using the resonator. In particular, this invention relates to an MEMS (Micro-Electro Mechanical Systems) element and relates to a vibration frequency adjusting method for a micro mechanical element in a resonator, a filter, an oscillator, a gyroscope, a pressure sensor, an optical scanner, a mass detection element etc. in each of which the micro mechanical element vibrates.

BACKGROUND ART

Figure 10:
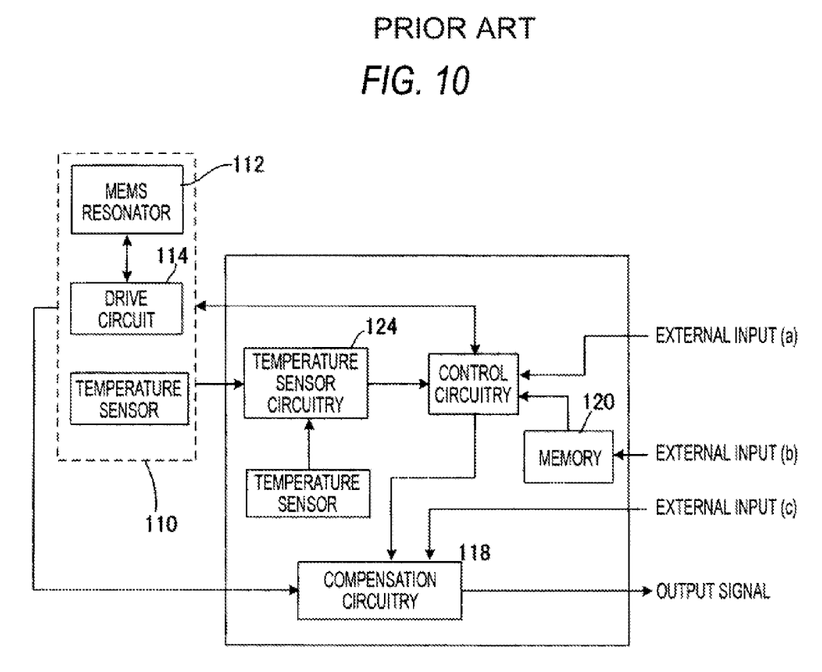
FIG. 10 is a diagram for explaining the method of adjusting the frequency in an oscillator of a related art.

An MEMS oscillator having an oscillation frequency adjusting function of the related art will be explained with reference to FIG. 10. FIG. 10 is a block diagram of an oscillator using the MEMS technique described in "a patent document 1". An MEMS resonator 112 is coupled to a drive circuit 114 and outputs an output signal having a frequency defined by the resonance frequency of the MEMS. The output signal is inputted into a compensation circuitry 118. When the frequency of the output signal of an MEMS oscillator 110 is used as a reference frequency, the compensation circuitry 118 outputs a signal which frequency is synchronously controlled to a frequency f that is an integer multiple, 1/integer number or a fractionally multiple of the reference frequency, by using a PLL circuit, a DLL (delay locked loop) or a digital frequency synthesizer. The multiple number is determined by a temperature sensor circuitry 124. The frequency shift of the output signal of the compensation circuitry 118 caused by the frequency shift of the output signal of the MEMS oscillator 110 due to the temperature can be suppressed by adaptively changing the multiple number. The setting values of the multiple number depending on the temperature are stored in a memory 120.

Figure 11:
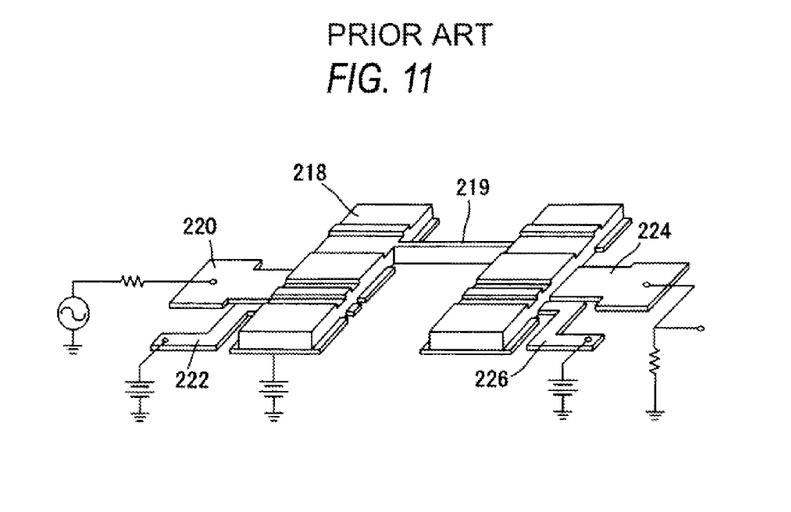
FIG. 11 is a diagram for explaining the method of adjusting the resonance frequency in a resonator of a related art.

The "patent document 1" shows an example of a method of adjusting the frequency at the external circuitry of the MEMS oscillator. On the other hand, "a patent document 2" discloses a method of adjusting the resonance frequency of an MEMS resonator. FIG. 11 is a perspective view of the MEMS resonator disclosed in the "patent document 2". Two clamped-clamped beam resonators 218 each supported at both ends thereof are disposed on a board in parallel to each other and are coupled by a coupling spring 219. Each of the resonators 218 has a flexural vibration mode that this resonator bends in a direction perpendicular to the substrate. Since the two resonators are coupled to each other, the coupled resonators have two closed resonance frequencies of an in-phase flexural vibration mode and a anti-phase flexural vibration mode. Electrodes 220 and 224 respectively disposed on the substrate with gaps from the associated resonators perform the excitation and the vibration detection of the resonator 218. Electrodes 222 and 226 for supplying tuning voltages V1Δf and V2Δf are disposed in adjacent to the electrodes 220 and 224, respectively. The resonance frequency of an electrostatic coupling type MEMS resonator can be tuned in accordance with a DC voltage difference between the resonator and the electrode. This is the frequency adjusting method using the phenomenon called "spring softening" in general in the electrostatic type transducer.

Like the "patent document 2", "a patent document 3" performs the frequency adjustment by providing a tuning electrode. The feature of the "patent document 3" resides in that a plurality of the tuning electrodes are provided. The plurality of tuning electrodes are provided so as not to apply the constraint of the electrostatic force due to the tuning voltage to a resonator asymmetrically. The same tuning voltage is applied to each of the plurality of tuning electrodes.

PRIOR ART DOCUMENT

Patent Documents

Patent Document 1 U.S. Pat. No. 6,995,622
Patent Document 2 U.S. Pat. No. 6,577,040
Patent Document 3 JP-A-2006-238265
Patent Document 4 U.S. Pat. No. 7,358,638

SUMMARY OF THE INVENTION

Problems that the Invention is to Solve

In general, the frequency adjustment of the MEMS oscillator employing silicon as the material of the vibrator represents the initial variance correction of the resonance frequency of a resonator mainly caused by the manufacturing dimensional error and the correction of the resonance frequency shift due to the temperature change. It is considered that the former is the frequency variance of almost in a range of ±1,000 ppm to ±10,000 ppm and the latter is within ±1,000 ppm.

In the case of performing the frequency correction widely as to both the initial variance correction and the temperature correction by using an external circuitry such as the PLL described in the "patent document 1", it is necessary to prepare many sets of dividing ratios finely determined. Thus, since an integer multiple PLL can not cope with the requirement, a fractional PLL is necessarily required. Since the small-number multiple PLL is configured to allocate different integer multiples within a constant time period at a constant ratio, the frequency deviation of the output signal of the PLL can be cancelled in appearance but jitter and phase noise are degraded.

Accordingly, in the case of the application requiring a strict specification as to jitter or phase noise, it is desirable to perform the temperature correction using a PLL coarsely based on the integer multiple to the extent possible and to perform the fine adjustment thereof by using the tuning voltage shown in the "patent document 2" or the "patent document 3". Ultimately, it is desirable to perform both the initial variance correction and the temperature correction by using the tuning voltage.

However, in the method of adjusting the resonance frequency of the MEMS resonator shown in the "patent document 2" and the "patent document 3", the frequency adjustment range is small in general. This is because a tuning electrode is disposed near the fixed terminal of a resonator having a small vibration amplitude. Thus, although the "patent document 3" is characterized in that the portion of the vibrator opposing to the tuning electrode is widened, to achieve this feature, the number of the design parameter of the resonance frequency of the vibrator is increased, thereby render the design difficult.

This invention is made in view of the aforesaid circumstances and an object of this invention is to, as to the frequency adjustment of an MEMS oscillator itself except for a PLL, secure a large frequency adjustment range while securing a frequency accuracy. Further, another object of this invention is to provide an oscillator with a high efficiency which suppresses jitter or phase noise due to the PLL even in a case of performing a large frequency adjustment by using the PLL.

Means for Solving the Problems

The resonator according to the invention includes a vibrator, a plurality of electrodes that oppose via gaps to portions of the vibrator having different amplitudes, respectively, and a DC voltage source that independently sets DC voltage differences between each of the plurality of electrodes and the vibrator.

According to this configuration, the resonance frequency of the resonator can be adjusted in a wide range and with a high accuracy.

Preferably, the vibrator includes a fixed portion, a torsion beam which is supported at least one end thereof by the fixed portion and vibrates torsionally, and a paddle which is coupled to the torsion beam and vibrates with an amplitude larger than the amplitude of the torsion beam, and further the plurality of electrodes includes an electrode opposing to the torsion beam and an electrode opposing to the paddle.

According to this configuration, since the coarse adjustment of the frequency can be performed by the DC voltage applied to the electrode opposing the paddle and the fine adjustment can be performed by the DC voltage applied to the electrode opposing the torsion beam, the frequency adjustment can be performed in a wide range and with a high accuracy as a whole.

The vibrator may include a fixed portion and a flexural vibration portion which is supported at least one end thereof by the fixed portion and vibrates flexurally, and the plurality of electrodes may oppose via gaps to portions of the flexural vibration portion having different amplitudes of flexural vibration, respectively.

Preferably, an impedance element is disposed between the plurality of electrodes and the DC voltage source or between the vibrator and the DC voltage source, wherein at a resonance frequency of the vibrator, an electrical impedance of the impedance element is larger than electrical impedances between each of the plurality of electrodes and the vibrator.

According to this configuration, since the impedance element such as a coil or a resistor having the electrical impedance larger than the electrical impedances between the electrodes and the vibrator is inserted, it is possible to suppress a phenomenon that an oscillation AC signal leaks to the DC voltage source to thereby increase the loss of the oscillator.

The oscillator according to this invention includes the resonator and an amplifier that amplifies an output signal of the resonator and inputs the amplified signal to the resonator as an input signal.

According to this configuration, it is possible to oscillate a high frequency which is adjusted in a wide range and with a high accuracy. The input electrode or the output electrode of the resonator may be used as the electrode coupled to the DC source in order to adjust the frequency.

Preferably, the oscillator further includes a temperature measuring portion that measures a temperature at periphery of the resonator, a memory that stores setting values of the DC voltage source corresponding to respective values of the peripheral temperature, and a control portion which reads the setting value of the DC voltage source from the memory based on the peripheral temperature measured by the temperature measuring portion to set the DC voltage source.

According to this configuration, since not only the initial variance of the resonance frequency of the resonator is corrected but also the DC voltage source is controlled in accordance with the temperature change in the environment where the oscillator is used, the oscillation frequency can be kept constant.

Preferably, the oscillator further includes a synchronizing portion that outputs a signal which is controlled so as to be synchronized with frequency f which is an integer multiple, 1/integer number or fractionally multiple of frequency fo by a PLL circuit, a DLL circuit or a digital frequency synthesizer, in a case where the frequency fo is a reference frequency.

According to this configuration, the frequency adjustment range of a wider range can be obtained.

BRIEF DESCRIPTION OF THE DRAWINGS

FIG. 1($a$) is the top view of a torsion vibrator according to the embodiment 1 of this invention, FIG. 1($b$) is a sectional diagram of the torsion vibrator in the vertical direction with respect to a torsional axis, and FIG. 1($c$) is a sectional diagram of the torsion vibrator along the torsional axis.

FIG. 2($a$) is a diagram showing the configuration of an oscillator according to the embodiment 1 of this invention, FIG. 2($b$) is a sectional diagram of the configuration of an oscillator along a line A1-A1', FIG. 2($c$) is a sectional diagram of the configuration of an oscillator along a line B1-B1' and FIG. 2($d$) is a sectional diagram of the configuration of an oscillator along a line C-C'.

MODE FOR CARRYING OUT THE INVENTION

The inventors of this invention performed various kinds of experimentations and notified that the frequency can be adjusted with a high accuracy in a wide range by independently adjusting DC voltage differences between a plurality of electrodes the vibrator. The plurality of electrodes are disposed close to a vibrator. That is, the inventors found that the frequency can be adjusted with a high accuracy in a wide range by performing a coarse adjustment at a portion near the maximum amplitude of the vibration in the vibrator and a fine adjustment at a portion near the minimum amplitude of the vibration in the vibrator and perform the adjustment by notifying this finding.

Hereinafter, embodiments of this invention will be explained in detail with reference to accompanying drawings.

Embodiment 1

FIGS. 1(a) to 1(c) are diagrams showing a vibrator constituting a resonator according to the embodiment 1 of this invention. FIG. 1(a) is a top view showing a vibrator 101 in the embodiment 1 of this invention. FIG. 1(b) is a diagram showing a section along a line A1-A1 and a line A2-A2' in FIG. 1(a). FIG. 1(c) is a diagram showing a section along a line B-B' in FIG. 1(a). The constitutional material of the vibrator 101 is monocrystalline silicon.

As shown in FIG. 1(a), anchors 2a, 2b are formed at the both ends of a torsion beam 1 acting as the main shaft of torsional vibration, respectively. The anchors 2a, 2b are fixed to a substrate (not shown) and constitute the vibrator. A paddle 3 acting as an additive mass is continuously coupled at the center portion of the torsion beam 1. When the vibrator 101 performs the torsional vibration around the torsion beam 1 acting as the main shaft, the paddle 3 functions as a rigid body, that is, a weight. The paddle 3 acts to generate a large rotational force from a small exciting force and to adjust a torsional resonance frequency.

The section along the line A1-A1 and the section along the line A2-A2' in FIG. 1(a) are shown in FIG. 1(b). Each of the torsion beam 1 and the paddle 3 constituting the vibrator does not contact with the substrate and is configured in a hollow structure to thereby be placed in a state of capable of vibrating. The side surface of each of the sections constitutes a slanted surface. This is because, since 100 monocrystalline silicon wafer is subjected to the anisotropic etching by using TMAH (Tetramethyl ammonium hydroxide) solution, a (111) surface is exposed on the slanted surface. The section along the line A1-A1' has a triangular shape or a trapezoidal shape close to the triangular shape, and the section along the line A2-A2' has a trapezoidal shape.

The section along the line B-B' in FIG. 1(a) is shown in FIG. 1(c). The anchors 2a, 2b are fixed to the substrate 100 via spacers 104. In the case of forming by the MEMS element forming process using a SOI (Silicon on On Insulator) board as the starting material, for example, the spacer 104 and the vibrator can be formed by a BOX (Buried Oxide) layer 102 and an SOI layer, respectively. Many etch holes are provided at the paddle shown in FIG. 1(a) so that etching gas (or liquid) likely flows into the lower portion side of a region where the paddle 3 is formed via etch holes 103 at the time of removing the BOX layer 102 by the etching so as to configure the paddle 3 in a hollow structure.

Figure 1:
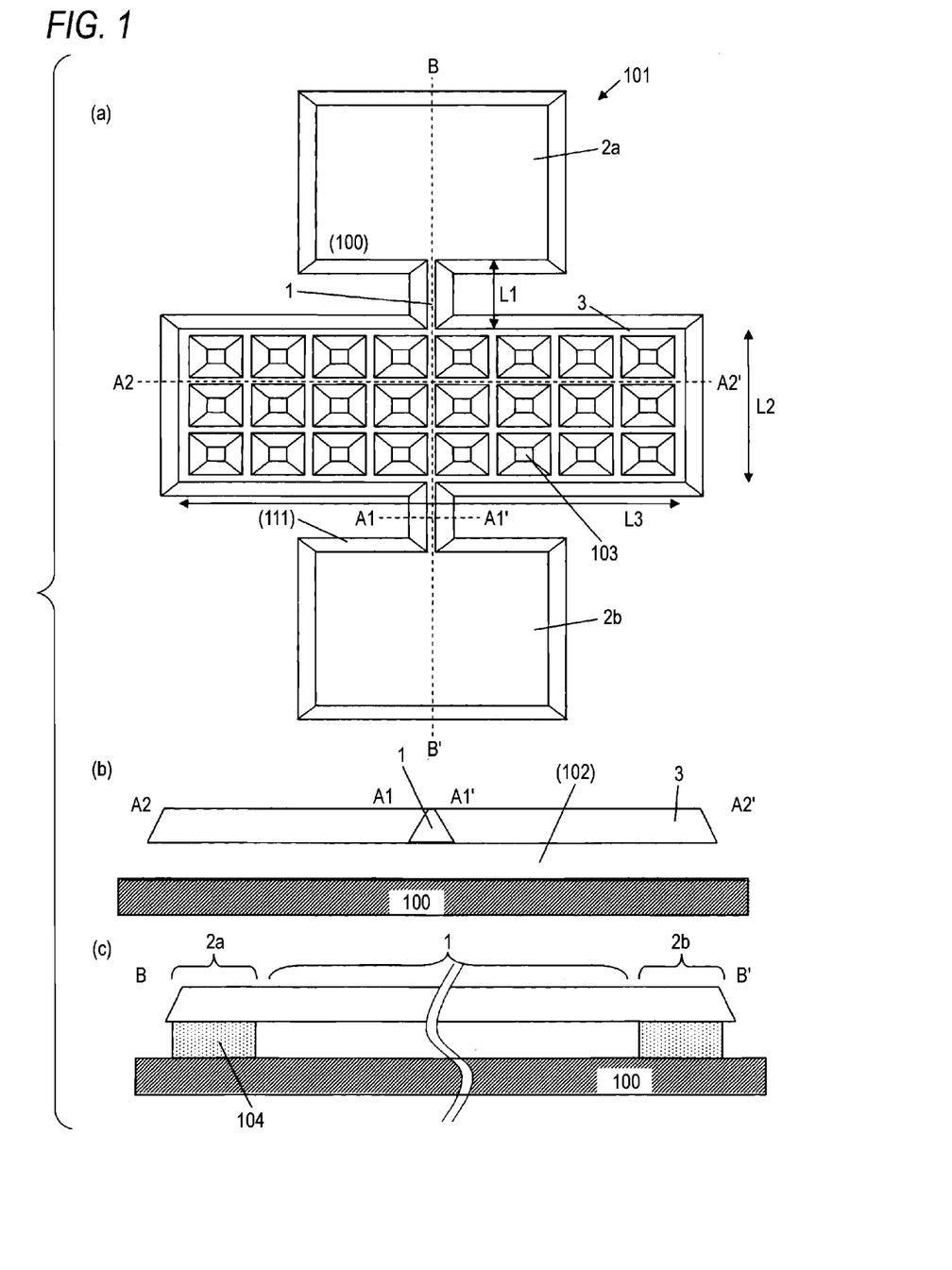
Figure 2:
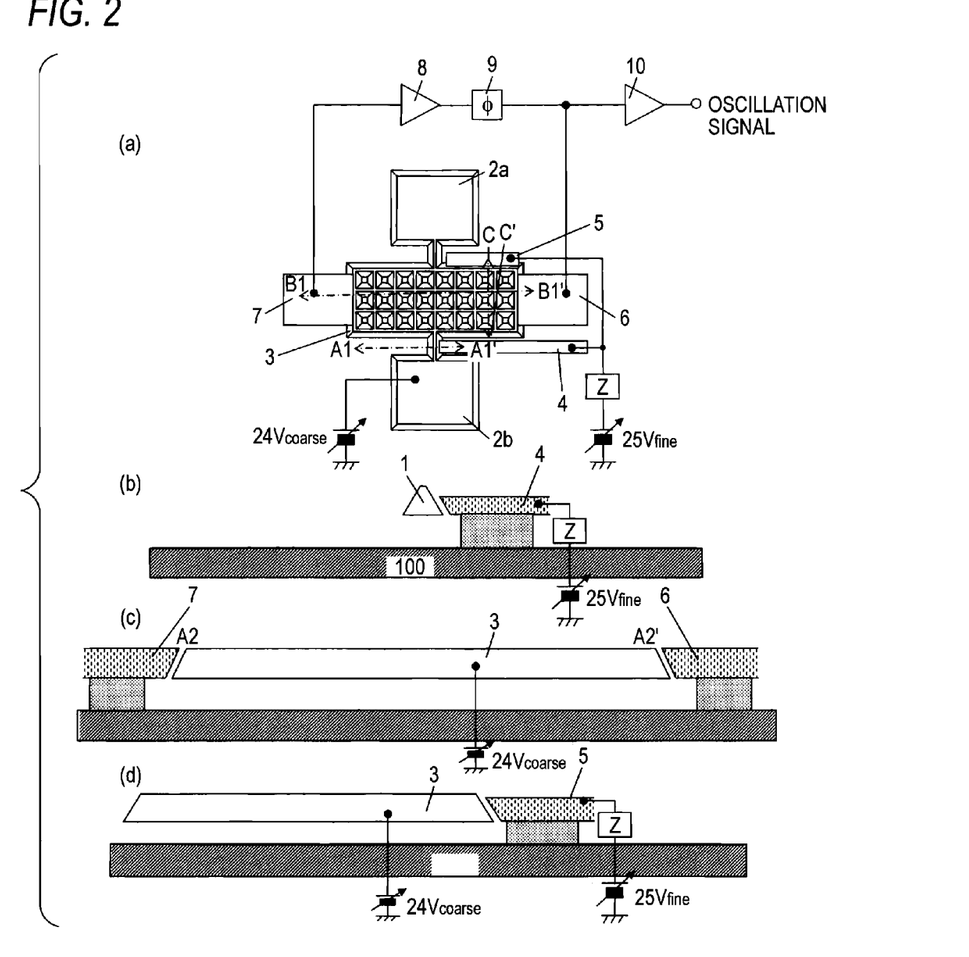

FIGS. 2(a) to 2(d) are diagrams showing the structure of an oscillator using the vibrator 101 shown in FIG. 1. As shown in FIG. 2(a), in this oscillator, a fine adjustment electrode 4 is disposed near the torsion beam 1 of the vibrator 101 and an input electrode 6 and an output electrode 7 are disposed near the outermost portions of the both ends of the paddle where the paddle 3 can deform most largely. An auxiliary fine adjustment electrode 5 as a fine adjustment electrode for auxiliary use is disposed near an area of the outer portion of the paddle 3 which is directed to the outermost portion from the torsion beam 1.

A section along a line A1-A1 at the periphery of the fine adjustment electrode 4 in FIG. 2(a) is shown in FIG. 2(b). The section of the torsion beam 1 has a trapezoidal shape close to a triangular shape. The fine adjustment electrode 4 is disposed in adjacent to the beam via a uniform gap to thereby form a capacitor. The thickness of the fine adjustment electrode 4 is set to be almost half of the thickness of the torsion beam 1 so that a ratio of a capacity change with respect to a torsion displacement amount becomes the maximum. The effect of this design is described in the patent document 4.

A section along a line B1-B1' at the periphery of the paddle 3, the input electrode 6 and the output electrode 7 is shown in FIG. 2(c). The input electrode 6 and the paddle 3 form a capacitor via a gap therebetween and also the output electrode 7 and the paddle 3 form a capacitor via a gap therebetween. The thickness of each of the input electrode 6 and the output electrode 7 is set to be same as the thickness of the paddle 3 so that a ratio of a capacity change with respect to a torsion displacement amount becomes the maximum, based on the patent document 4.

A section along a line C-C' at the periphery of the paddle 3 and the auxiliary fine adjustment electrode 5 is shown in FIG. 2(d). The thickness of the auxiliary fine adjustment electrode 5 is set to be an intermediate value between the thickness of the fine adjustment electrode 4 and the thickness of the input and output electrodes 6, 7.

When an AC signal is applied to the input electrode 6, an AC signal flows to the output electrode 7 at the torsional resonance mode frequency of the vibrator 101. When this output AC signal is returned to the input electrode 6 via an amplifier 8 while adjusting the gain of the amplifier 8 and the phase of a phase adjuster 9, the oscillation starts at the torsional resonance mode frequency to thereby act as the oscillator. An oscillation signal is outputted via a buffer 10.

A DC voltage Vfine is inputted to each of the fine adjustment electrode 4 and the auxiliary fine adjustment electrode 5 as a control input and the voltage Vcoarse of a coarse-adjustment variable voltage source 24 as a coarse adjustment DC voltage is inputted to the vibrator 101 as a control input. Thus, a DC voltage difference ΔVfine between the vibrator 101 and the fine adjustment electrode 4 and the auxiliary fine adjustment electrode 5 is |Vcoarse−Vfine|. On the other hand, when an inverter amplifier is used as the amplifier 8, since the DC operational voltage of the amplifier 8 becomes almost half of a supply voltage Vdd to an inverter due to a self bias circuit, a DC voltage difference ΔVcoarse between the vibrator and the input electrode (or the output electrode) becomes |Vcoarse−0.5 Vdd|.

It will be shown by using the sizes of the concrete resonator that the frequency can be adjusted with a high accuracy by using the ΔVfine and ΔVcoarse.

In the vibrator shown in FIG. 1(a), supposing that the sizes of the torsion beam 1 and the paddle 3 are L1=30 μm, L2=20 μm and L3=20 μm, the vibrator has the torsion vibration mode of about 4 MHz. The same control DC voltage Vfine is applied to each of the fine adjustment electrode 4 and the auxiliary fine adjustment electrode 5 as shown in FIG. 2(a). An AC block impedance element Z is inserted between a DC voltage source Vfine and the fine adjustment electrode 4 and the auxiliary fine adjustment electrode 5 so that the AC signal of the oscillation frequency does not leak to the voltage source Vfine. The impedance of the impedance element Z is set to be larger than electric impedances between the vibrator 101 and the respective electrodes opposing to the vibrator 101 at the resonance frequency of the vibrator 101. Thus, the aforesaid effects of preventing the leakage of the AC signal of the oscillation frequency to the fine-adjustment variable voltage source 25 can be enhanced.

Figure 3:
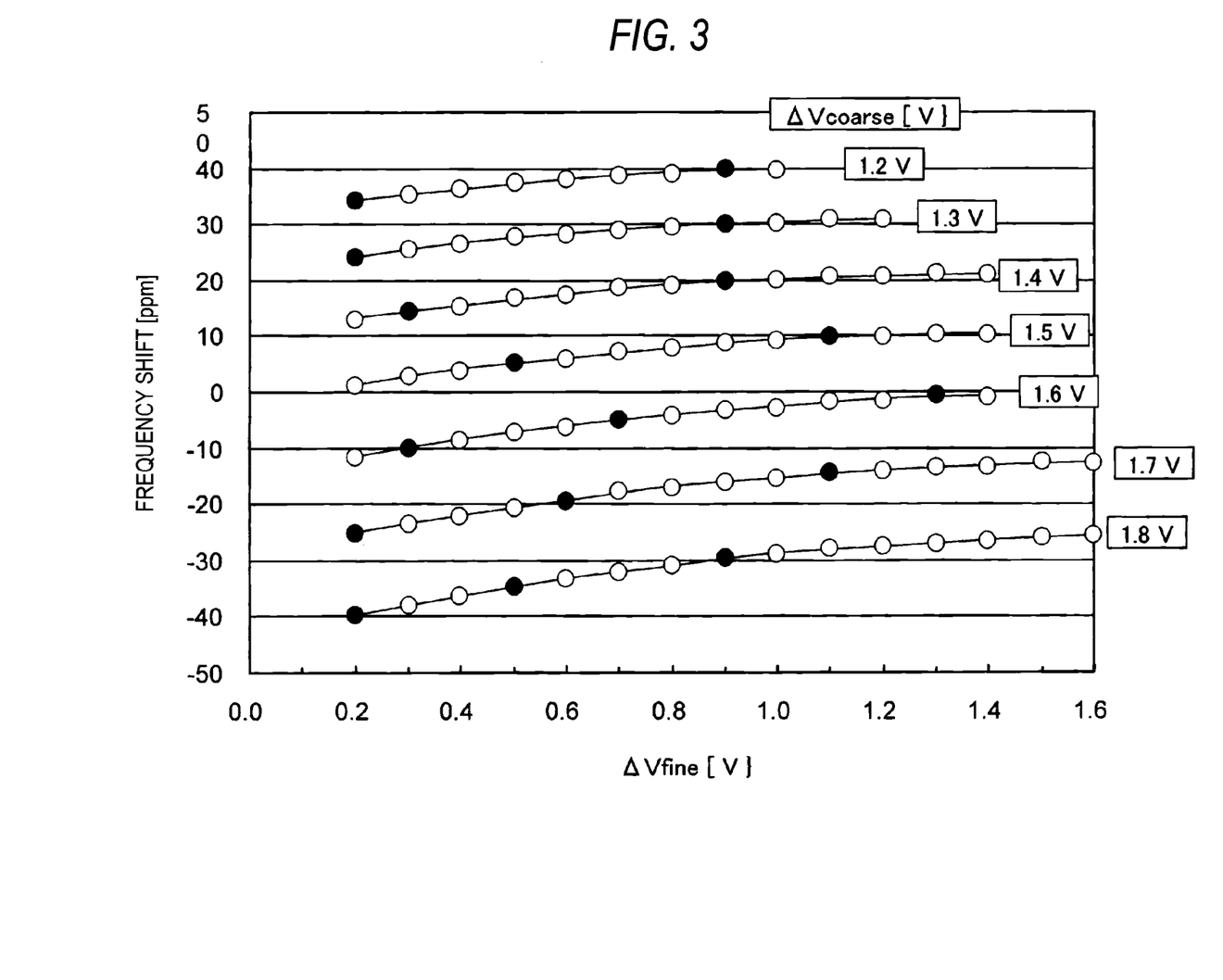
FIG. 3 is a diagram showing the resonance frequency shift of the torsion vibrator according to the combination of ΔVfine and ΔVcoarse in the embodiment 1 of this invention.

FIG. 3 shows a relation between the ΔVfine (abscissa) and the frequency adjustment value (ordinate) when ΔVcoarse takes respective values from 1.2 V to 1.8 V. First, the voltage Vcoarse of the coarse-adjustment DC voltage source as the coarse-adjustment variable voltage source 24 is selected so that the ΔVcoarse takes a constant value from 1.2 V to 1.8 V, then the voltage of the fine-adjustment variable voltage source 25 is adjusted under the condition that the ΔVcoarse is the constant value. Supposing that each of the ΔVcoarse and ΔVfine has the accuracy of 0.1 V, the frequencies represented by symbols ○ plotted on graphs in FIG. 3 can be selected. When only the filled symbols among all the symbols ○ are selected, the frequency can be adjusted on 5 ppm unit from −40 ppm to +40 ppm.

Figure 4:
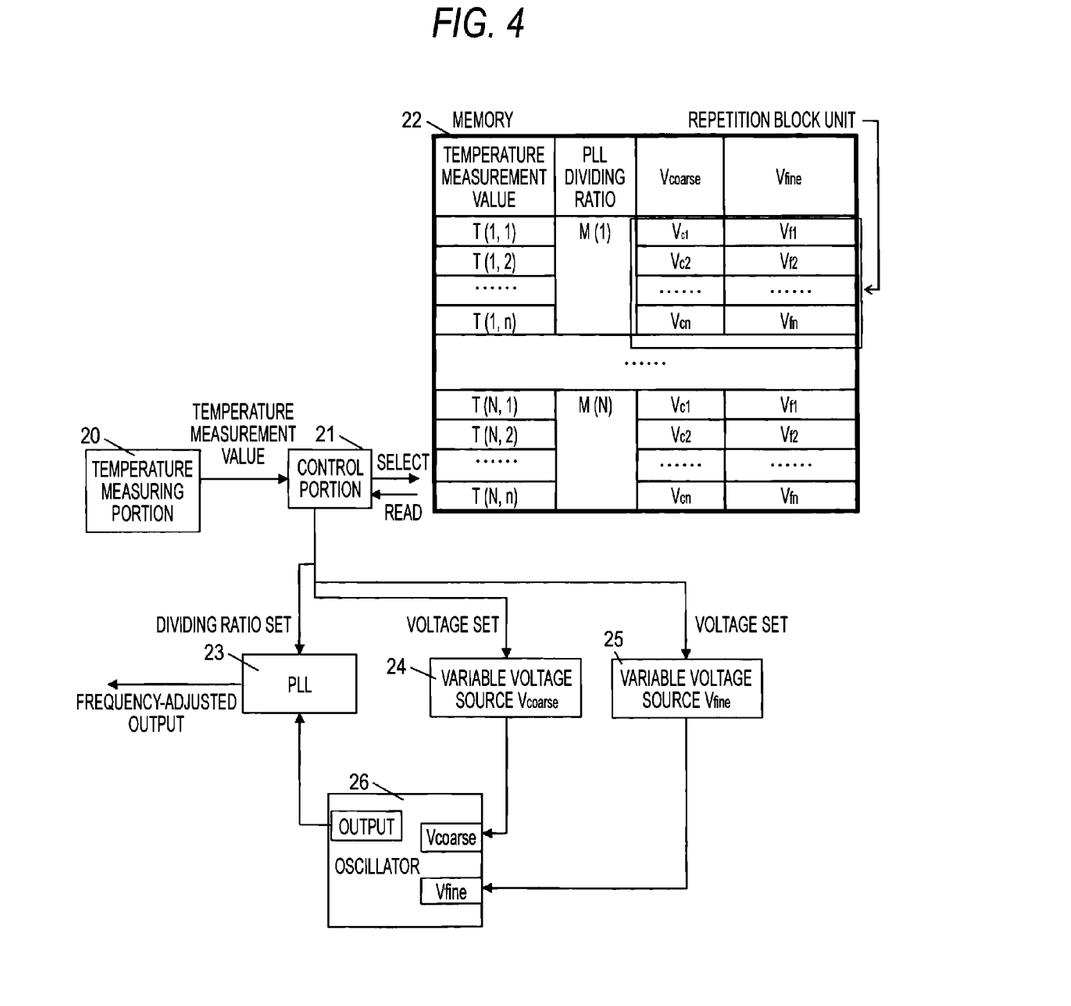
FIG. 4 is a block diagram showing the frequency adjustment function of the oscillator in the embodiment 1 of this invention.

FIG. 4 is a block diagram of the oscillator having the temperature adjustment function formed by combining the frequency correction based on the ΔVcoarse and ΔVfine and the frequency correction based on a PLL. This oscillator is configured by a temperature measuring portion 20, a control portion 21, a memory 22, the PLL 23, the coarse-adjustment variable voltage source 24, the fine-adjustment variable voltage source 25 and an oscillator 26. The temperature measuring portion 20 measures the temperature of the resonator or the temperature at the periphery of the resonator. The control portion 21 reads the temperature measurement value and selectively reads stored information within the memory 22. In the memory 22, the dividing ratio M of the PLL 23, the setting value of the Vcoarse and the setting value of the Vfine are allocated to each of the respective temperature measurement values.

The temperature measurement value has ranks of M×n, that is, T(1, 1) . . . T(1, n), T(2, 1) . . . T(2, n), T(N, 1) . . . T(N, n). In contrast, the dividing ratio M of the PLL 23 has N values from M(1) to M(N). One dividing ratio is allocated to the continuous n temperature values. Further, n combinations of the Vcoarse and Vfine are stored as to the single dividing ratio. These combinations correspond to the combinations of the voltage Vcoarse of the coarse-adjustment variable voltage source 24 and the voltage Vfine of the fine-adjustment variable voltage source 25 for realizing the ΔVcoarse and ΔVfine represented by the filled symbols ○ plotted on the graphs in FIG. 3.

When the control is performed based on the combination of the PLL and the DC voltage sources for the plural electrodes, the frequency correction can be made with a high accuracy by preparing the N dividing ratios without requiring the M×n ranks of the PLL dividing ratio control. Since the DC current flows from the DC voltage source only at the time of changing the voltage, an amount of the consumption current can be reduced. The n combinations of the Vcoarse of the coarse-adjustment variable voltage source 24 and the voltage Vfine of the fine-adjustment variable voltage source 25 constitute a single repetition block. Thus, it is not necessary to store the combinations in corresponding to each of the PLL dividing ratios M(1) to M(N) and hence it is sufficient to store only one block, so that the capacity of the memory can be saved.

In this embodiment, although the two electrodes, that is the fine adjustment electrode 4 and the auxiliary fine adjustment electrode 5 are used as the fine adjustment electrode, the invention can attain the similar effects even when only one of these electrodes is used. That is, when a single electrode is set as the fine adjustment electrode and the characteristics shown in FIG. 3 is measured in the configuration, the frequency can be adjusted like this embodiment. Further, three or more electrodes may be employed as the fine adjustment electrode.

Embodiment 2

Next, the explanation will be made as to an oscillator according to the embodiment 2 of this invention.

Figure 5:
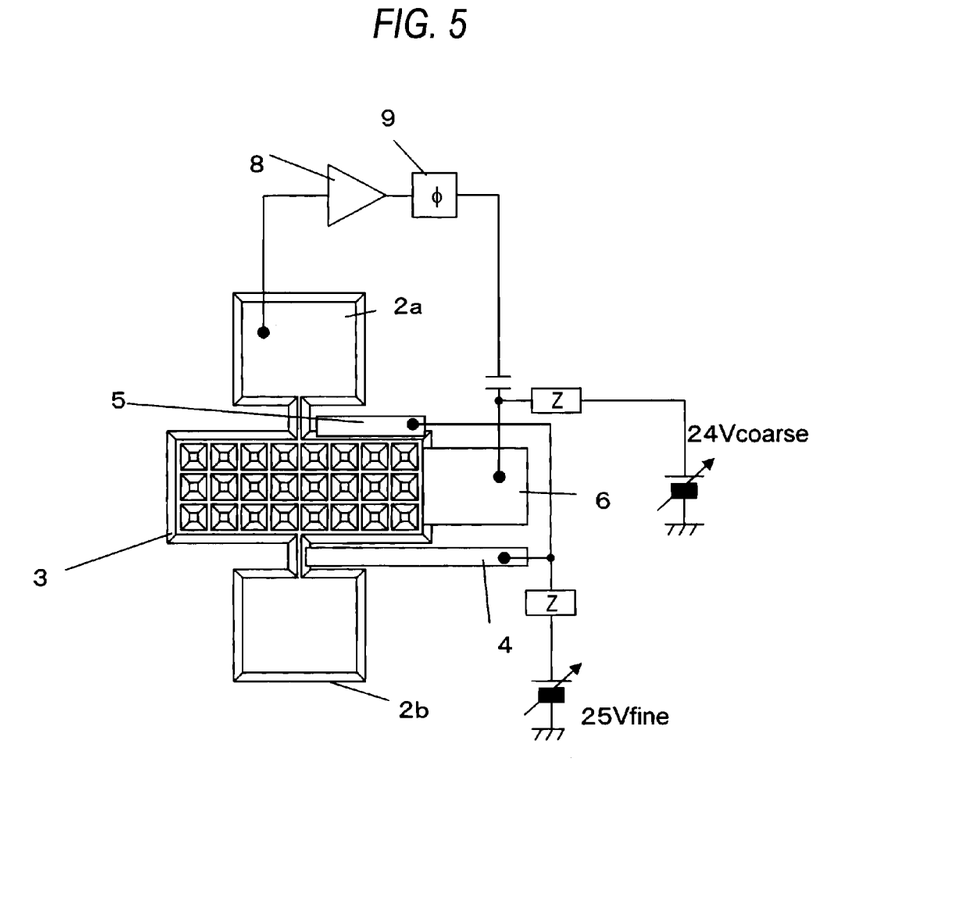
FIG. 5 is a diagram for explaining the configuration of an oscillator according to the embodiment 2 of this invention.

The oscillator according to this embodiment is shown in FIG. 5. As clear from the comparison with the configuration shown in FIG. 2, in this embodiment, the output electrode is omitted and the vibrator has the function of the output electrode. A wire is extracted from the anchor 2a of the vibrator and coupled to the amplifier. In this embodiment, since the DC voltage of the vibrator is fixed to the DC voltage at the DC operation point of the amplifier 8, the DC voltage difference ΔVcoarse between the vibrator and the input electrode 6 is adjusted by the voltage Vcoarse of the coarse-adjustment variable voltage source 24. Further the voltage difference ΔVfine between the vibrator and the fine adjustment electrode 4 and the auxiliary fine adjustment electrode 5 is adjusted by the voltage Vfine of the fine-adjustment variable voltage source 25. In the oscillator thus configured, the frequency can also be adjusted finely by the relation between the ΔVcoarse and the ΔVfine as shown FIG. 3. The concrete frequency adjustment method is same as that of the embodiment 1.

Embodiment 3

Next, the explanation will be made as to an oscillator according to the embodiment 3 of this invention.

Figure 6:
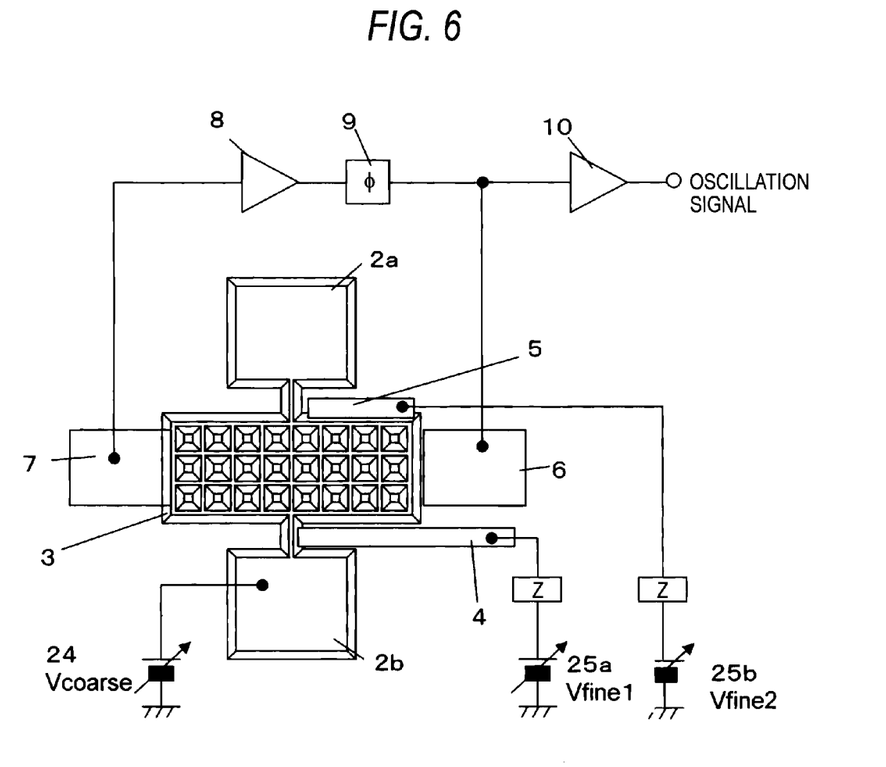
FIG. 6 is a diagram for explaining the configuration of an oscillator according to the embodiment 3 of this invention.

The oscillator according to this embodiment is shown in FIG. 6. In this embodiment, the explanation will be made as to the configuration of a fixed dividing-ratio PLL not required for controlling the dividing ratio of the PLL or the configuration of an oscillator not requiring the PLL itself.

In the vibrator having the configuration of the embodiment 1 shown in FIG. 1(a), supposing that the sizes thereof are L1=100 μm, L2=100 μm and L3=200 μm, the vibrator has the torsional vibration mode of about 32 kHz. The oscillator structure shown in FIG. 6 is configured by using this vibrator. In this embodiment, although the arrangement of the electrodes is same as the oscillator of the embodiment 1 shown in FIG. 2, fine-adjustment variable voltage sources 25a (voltage Vfine1) and 25b (voltage Vfine2) are independently coupled to the fine adjustment electrode 4 and the auxiliary fine adjustment electrode 5 as shown in FIG. 6, respectively. The voltage of the input electrode 6 is fixed to 0.5 Vdd.

Next, the explanation will be made as to the frequency adjusting operation of this oscillator.

In the oscillator of this embodiment, firstly the coarse adjustment of frequency is performed. The DC voltage difference between the vibrator and the input electrode 6 is controlled by controlling the DC voltage Vcoarse of the coarse-adjustment variable voltage source 24 applied to the vibrator. The input electrode 6 is provided in the vicinity of a portion of the vibrator which mostly displaces, that is, in the vicinity of the outermost portion of the paddle 3 which mostly displaces, and the voltage difference between the input electrode 6 and the vibrator is controlled, whereby the resonance frequency can be adjusted coarsely over a wide frequency range.

The frequency adjusting method in this embodiment will be explained with reference to FIG. 7.

Figure 7:
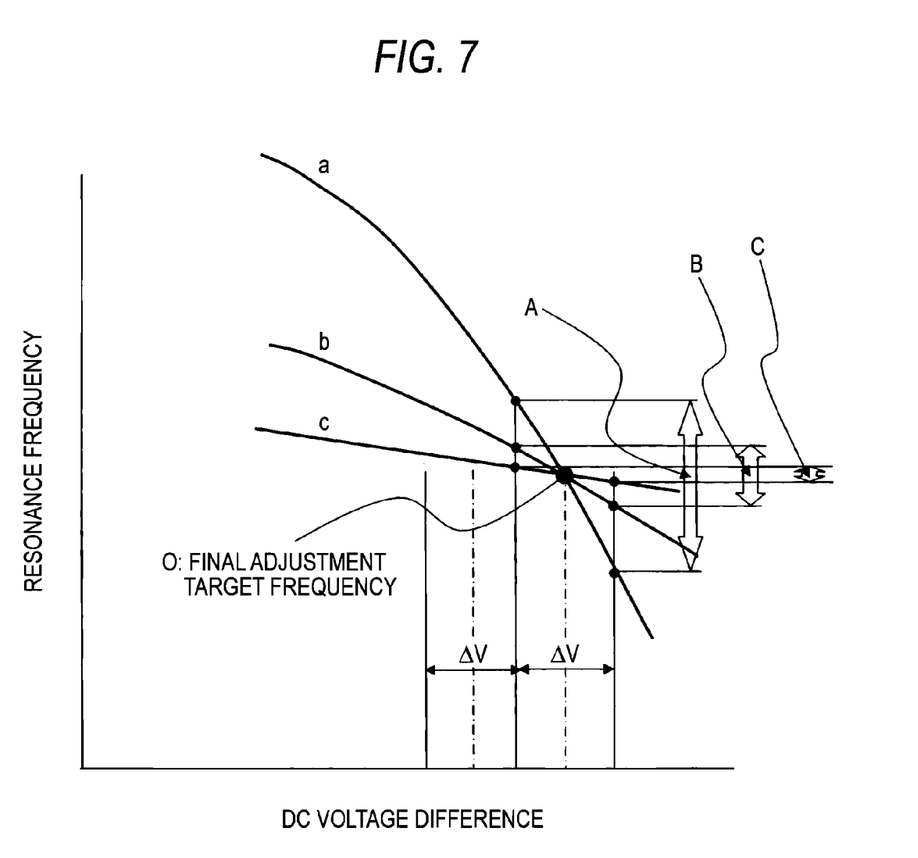
FIG. 7 is a diagram for explaining the process of adjusting the frequency to a final adjustment target frequency by three frequency adjusting voltages in the oscillator according to the embodiment 3 of this invention.

In graphs shown in FIG. 7, the abscissa represents the DC voltage difference and the ordinate represents the resonance frequency. The DC voltage difference on the abscissa represents difference values with respect to curves a, b and c. That is, as to the curve a, the abscissas represents the voltage difference between the voltage Vcoarse of the coarse-adjustment variable voltage source 24 and the voltage 0.5 Vdd of the input electrode 6. As to the curve b, the abscissas represents the voltage difference between the voltage Vfine2 of the first fine-adjustment variable voltage source 25b and the voltage Vcoarse of the coarse-adjustment variable voltage source 24. As to the curve c, the abscissas represents the voltage difference between the voltage Vfine1 of the second fine-adjustment variable voltage source 25a and the voltage Vcoarse of the coarse-adjustment variable voltage source 24. Supposing that the accuracy of the DC voltage source is ΔV, the variance of the resonance frequency can be suppressed to a range shown by an arrow A by the coarse adjustment.

Next, the intermediate adjustment of the frequency is performed. The DC voltage difference between the vibrator 101 and the auxiliary fine adjustment electrode 5 is controlled by controlling the DC voltage Vfine2 of the first fine-adjustment variable voltage source 25b applied to the auxiliary fine adjustment electrode 5 for the frequency adjustment. As shown by the curve b in FIG. 7, the frequency is adjusted with an intermediate inclination with respect to the DC voltage difference, whereby the frequency variance can be suppressed to a frequency variance range B supposing that the accuracy of the DC voltage source is ΔV. The frequency variance due to the error of the shape of the vibrator can be suppressed to a range shown by the arrow B by using both the aforesaid coarse adjustment and this intermediate adjustment.

Lastly, the fine adjustment of the frequency is performed. The DC voltage difference between the vibrator 101 and the frequency fine adjustment electrode 4 is controlled by controlling the DC voltage Vfine2 of the second fine-adjustment variable voltage source 25a applied to the fine adjustment electrode 4. As shown by the curve c in FIG. 7, the frequency is adjusted with the minimum inclination with respect to the DC voltage difference, whereby the frequency variance can be suppressed to a range shown by an arrow C with respect to a final adjustment target frequency O supposing that the accuracy of the DC voltage source is ΔV. This fine adjustment can be used mainly in order to correct the frequency shift as to the temperature change of the resonator.

Figure 8:
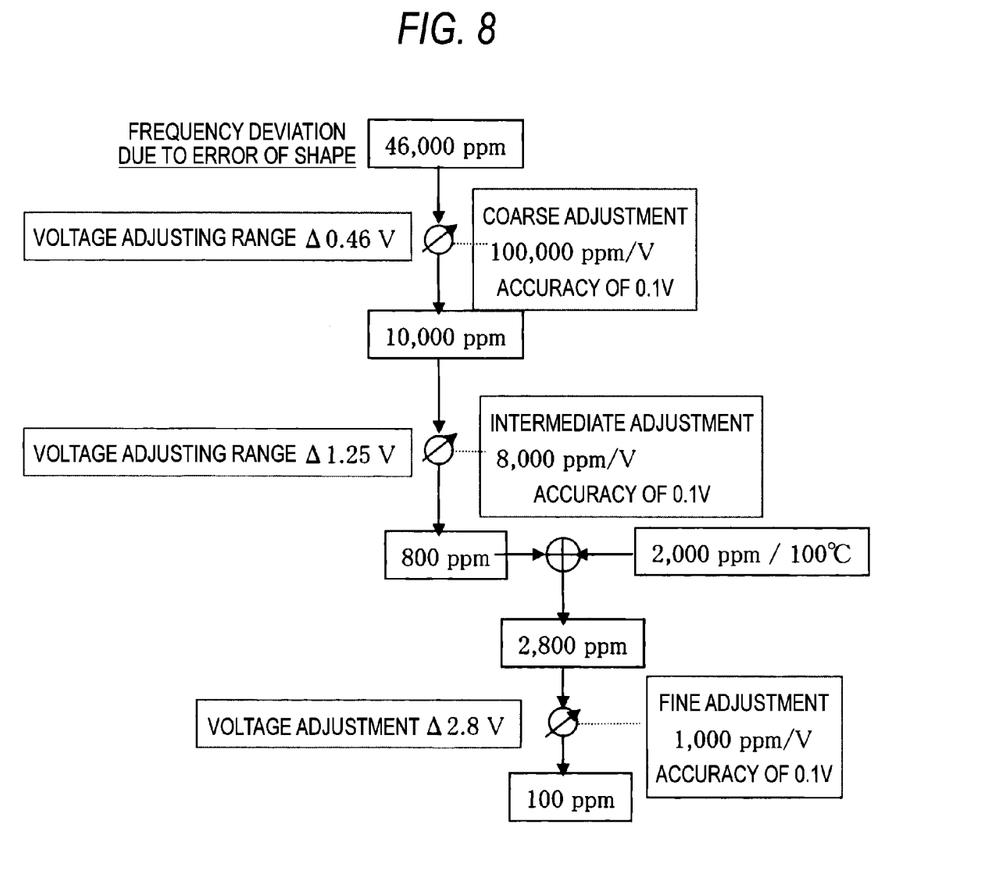
FIG. 8 is a diagram for explaining the method of correcting the frequency deviation due to the error of the shape of the vibrator and the frequency shift due to the temperature change in the embodiment 3 of this invention.

FIG. 8 is a diagram for explaining more concretely the operation for gradually adjusting the frequency. The vibrator has the frequency deviation of 46,000 ppm at the initial stage due to the error of the shape at the time of processing the vibrator. Firstly, the frequency deviation is reduced to 10,000 ppm by the coarse adjustment. Since the coarse adjustment has the adjusting ability of 100,000 ppm per 1 V, it is possible to reduce to 10,000 ppm by changing the voltage adjusting range 0.46 V in 46 stages with the accuracy of 0.1 V. Next, the intermediate adjustment is performed. Since the intermediate adjustment has the adjusting ability of 8,000 ppm per 1 V, it is possible to reduce to 800 ppm by changing the voltage adjusting range 1.25 V in 13 stages with the accuracy of 0.1 V. The frequency shift due to the temperature is added to 800 ppm. In the case of the silicon vibrator, the frequency shift of about 2,000 ppm/100° C. is expected. Thus, the frequency deviation of 2,800 ppm is reduced to 100 ppm by the final fine adjustment. Since the fine adjustment has the adjusting ability of 1,000 ppm per 1 V, the frequency adjustment can be performed so as to reduce the deviation to 100 ppm by changing the voltage adjusting range 2.8 V in 28 stages with the accuracy of 0.1 V.

As explained above, it is possible to provide the oscillator with a high frequency accuracy by independently adjusting the DC voltage differences between the vibrator and the plural electrodes. The oscillator may be arranged in a manner that the oscillator is used as a signal source fo, and a PLL circuit, a DLL circuit or a digital frequency synthesizer is coupled to the rear stage of the oscillator, and further a synchronizing portion is added which outputs a signal that is controlled so as to be synchronized with the frequency f that is an integer multiple, 1/integer number or fractionally multiple of the fo. Alternatively, the oscillator may be used as a signal generating source of an arbitrary frequency by setting the multiple number not as a fixed value but as a programmable value.

Embodiment 4

Next, the explanation will be made in detail with reference to a drawing as to the embodiment 4 of this invention.

Figure 9:
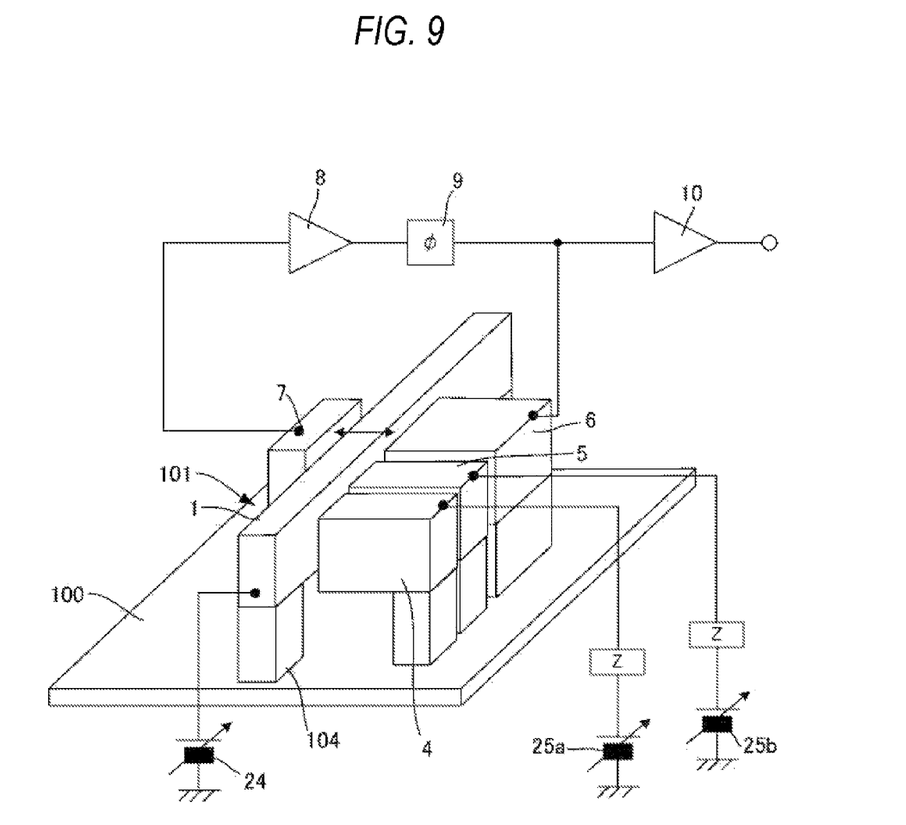
FIG. 9 is a diagram for explaining the configuration of an oscillator according to the embodiment 4 of this invention.

Although the explanation is made as to the torsional vibration in each of the embodiments 1 to 3, the invention can also be applied to flexural vibration. FIG. 9 is an example where the torsional vibrator is replaced by a flexural vibrator in the configuration of the oscillator shown in FIG. 6 where the torsional vibrator explained in the embodiment 3 is employed. In FIG. 9, a vibrator 101 formed by a clamped-clamped beam which both ends are fixed to the board 100 via the spacers 104 is a flexural vibration mode vibrator which vibrates in the horizontal direction with respect to the board. The input electrode 6 and the output electrode 7 are disposed via gaps therebetween at the center portion along the longitudinal direction of the vibration portion of this vibrator, that is, the maximum amplitude portion of the flexural basic mode. The coarse adjustment of the flexural resonance frequency is performed according to the difference between the DC voltage Vcoarse of the vibrator 101 and the DC voltage of the input electrode 6. The vibrator opposes to the auxiliary fine adjustment electrode 5 at a portion thereof toward the one of the fixed ends (minimum or no amplitude portions) apart from the maximum amplitude portion and opposes to the fine adjustment electrode 4 near the one fixed end (minimum or no amplitude portion). The auxiliary fine adjustment (intermediate adjustment) of the frequency is performed according to the DC voltage difference between the first variable voltage source 25b (voltage Vfine2) of the auxiliary fine adjustment electrode 5 and the voltage Vcoarse of the variable voltage source 24. The final fine adjustment of the frequency is performed according to the DC voltage difference between the second variable voltage source 25a (DC voltage Vfine1) of the fine adjustment electrode 4 and the voltage Vcoarse of the variable voltage source 24.

As explained above, it is possible to provide the oscillator with a high frequency accuracy by independently adjusting the DC voltages of the plural electrodes.

Although, in this embodiment, both the fine adjustment electrode 4 and the auxiliary fine adjustment electrode 5 are used as the fine adjustment electrode, the similar effects as this embodiment can be attained in the case of using one of these electrodes. Alternatively, it is possible to provide three or more electrodes as the fine adjustment electrode.

This application is based on Japanese Patent Application filed on Jun. 9, 2009 (Japanese Patent Application No. 2009-138455), the contents of which are incorporated herein by reference.

INDUSTRIAL APPLICABILITY

The resonator according to the invention and the oscillator using the resonator can adjust the frequency with a high accuracy by independently controlling the plural DC voltages. Thus, this invention can be developed to wide industrial usages such as a filter, a gyroscope, a pressure sensor, an optical scanner, a mass detection element as well as the oscillator.

REFERENCE SIGNS LIST 101 vibrator
102 BOX layer
103 etch hole
1 torsion beam
2a, 2b anchor 3 paddle
4 fine adjustment electrode
5 auxiliary fine adjustment electrode
6 input electrode
7 output electrode
8 amplifier
9 phase adjuster
10 buffer

The invention claimed is:

1. A resonator, comprising:
a vibrator that performs a torsional vibration;
a coarse adjustment electrode that performs a coarse adjustment of a resonant frequency of the vibrator at a portion near a maximum amplitude of vibration and opposes via a gap to the vibrator;
a fine adjustment electrode that performs a fine adjustment of the resonant frequency of the vibrator at a portion near a minimum amplitude of vibration and opposes via a gap to the vibrator; and
a DC voltage source that sets DC voltage differences between each of the electrodes and the vibrator, the setting of one of the DC voltage differences being independent from setting of the other of the DC voltage differences.

2. The resonator according to claim 1, wherein the vibrator includes a fixed portion, a torsion beam which is supported at at least one end thereof by the fixed portion and vibrates torsionally, and a paddle which is coupled to the torsion beam and vibrates with an amplitude larger than the amplitude of the torsion beam; and
wherein the electrodes include an electrode opposing to the torsion beam and an electrode opposing to the paddle.

3. The resonator according to claim 1, further comprising:
an impedance element that is disposed between the electrodes and the DC voltage source or between the vibrator and the DC voltage source;
wherein at a resonance frequency of the vibrator, an electrical impedance of the impedance element is larger than electrical impedances between each of the electrodes and the vibrator.

4. An oscillator, comprising:
the resonator according to claim 1; and
an amplifier that amplifies an output signal of the resonator and inputs the amplified signal to the resonator as an input signal.

5. The oscillator according to claim 4, further comprising:
a temperature measuring portion that measures a temperature at periphery of the resonator;
a memory that stores setting values of the DC voltage source corresponding to respective values of the peripheral temperature; and
a control portion which reads the setting value of the DC voltage source from the memory based on the peripheral temperature measured by the temperature measuring portion to set the DC voltage source.

6. The oscillator according to claim 4, further comprising:
a synchronizing portion that outputs a signal which is controlled so as to be synchronized with frequency f which is an integer multiple, 1/integer number or fractionally multiple of frequency fo by a PLL circuit, a DLL circuit or a digital frequency synthesizer, in a case where the frequency fo is a reference frequency.

7. A resonator, comprising:
a vibrator that vibrates torsionally;
a plurality of electrodes that oppose via gaps to portions of the vibrator having different amplitudes, respectively; and
a DC voltage source that independently sets DC voltage differences between each of the plurality of electrodes and the vibrator,
wherein the vibrator includes a fixed portion, a torsion beam which is supported at least one end thereof by the fixed portion and vibrates torsionally, and a paddle which is coupled to the torsion beam and vibrates with an amplitude larger than the amplitude of the torsion beam; and
wherein the plurality of electrodes includes an electrode opposing to the torsion beam and an electrode opposing to the paddle.

8. A resonator, comprising:
a vibrator that vibrates torsionally;
a plurality of electrodes that oppose via gaps to portions of the vibrator having different amplitudes, respectively; and
a DC voltage source that independently sets DC voltage differences between each of the plurality of electrodes and the vibrator, and
an impedance element that is disposed between the plurality of electrodes and the DC voltage source or between the vibrator and the DC voltage source;
wherein at a resonance frequency of the vibrator, an electrical impedance of the impedance element is larger than electrical impedances between each of the plurality of electrodes and the vibrator.

9. An oscillator, comprising:
a resonator; and
an amplifier that amplifies an output signal of the resonator and inputs the amplified signal to the resonator as an input signal, wherein the resonator comprises:
a vibrator that vibrates torsionally;
a plurality of electrodes that oppose via gaps to portions of the vibrator having different amplitudes, respectively; and
a DC voltage source that independently sets DC voltage differences between each of the plurality of electrodes and the vibrator.

10. The oscillator according to claim 9, further comprising:
a temperature measuring portion that measures a temperature at periphery of the resonator;
a memory that stores setting values of the DC voltage source corresponding to respective values of the peripheral temperature; and
a control portion which reads the setting value of the DC voltage source from the memory based on the peripheral temperature measured by the temperature measuring portion to set the DC voltage source.

11. The oscillator according to claim 9, further comprising:
a synchronizing portion that outputs a signal which is controlled so as to be synchronized with frequency f which is an integer multiple, 1/integer number or fractionally multiple of frequency fo by a PLL circuit, a DLL circuit or a digital frequency synthesizer, in a case where the frequency fo is a reference frequency.

* * * * *

UNITED STATES PATENT AND TRADEMARK OFFICE
CERTIFICATE OF CORRECTION

PATENT NO. : 8,368,473 B2
APPLICATION NO. : 13/063316
DATED : February 5, 2013
INVENTOR(S) : Kunihiko Nakamura It is certified that error appears in the above-identified patent and that said Letters Patent is hereby corrected as shown below:

In the Specifications:

Column 5, line 10, delete "A1-A1" and insert --A1-A1'--
Column 5, line 25, delete "A1-A1" and insert --A1-A1'--
Column 5, line 51, delete "A1-A1" and insert --A1-A1'--

Signed and Sealed this
Twenty-eighth Day of May, 2013

Teresa Stanek Rea
*Acting Director of the United States Patent and Trademark Office*